United States Patent [19]

Ogawa et al.

[11] Patent Number: 5,011,783
[45] Date of Patent: Apr. 30, 1991

[54] FORMING SELECTIVE SINGLE CRYSTAL REGIONS IN INSULATED POCKETS FORMED ON SILICON BY ENERGY BEAMS AND DEVICES FORMED IN THE POCKETS

[75] Inventors: Tsutomu Ogawa, Tokyo; Hajime Kamioka, Yokohama; Seiichiro Kawamura; Junji Sakurai, both of Tokyo, all of Japan

[73] Assignee: Fujitsu Limited, Kawasaki, Japan

[21] Appl. No.: 553,361

[22] Filed: Jul. 16, 1990

Related U.S. Application Data

[63] Continuation of Ser. No. 342,646, Apr. 24, 1989, abandoned, which is a continuation of Ser. No. 233,890, Aug. 18, 1988, abandoned, which is a continuation of Ser. No. 105,495, Oct. 2, 1987, abandoned, which is a continuation of Ser. No. 943,843, Dec. 22, 1986, abandoned, which is a continuation of Ser. No. 823,839, Jan. 31, 1986, abandoned, which is a continuation of Ser. No. 706,896, Feb. 28, 1985, abandoned, which is a continuation of Ser. No. 454,078, Dec. 28, 1982, abandoned.

[30] Foreign Application Priority Data

Dec. 28, 1981 [JP] Japan .................. 56-211191

[51] Int. Cl.⁵ .................. C30B 33/00; C30B 1/02; H01L 21/263
[52] U.S. Cl. .................. 437/19; 357/9.1; 427/53.1; 437/21; 437/171
[58] Field of Search .......... 437/19, 21, 171; 427/53.1; 357/91

[56] References Cited

U.S. PATENT DOCUMENTS

| | | | |
|---|---|---|---|
| 4,174,217 | 11/1979 | Flatly | 148/187 |
| 4,330,363 | 5/1982 | Biegesen et al. | 156/620 |
| 4,372,990 | 2/1983 | Lam | 427/53.1 |
| 4,377,031 | 3/1983 | Goto et al. | 29/576 B |
| 4,381,201 | 4/1983 | Sakurai | 148/1.5 |
| 4,383,883 | 5/1983 | Mitzutani | 156/603 |
| 4,409,724 | 10/1983 | Tasch, Jr. et al. | 29/571 |
| 4,414,242 | 11/1983 | Nishimura et al. | 427/53.1 |
| 4,448,632 | 5/1984 | Akasaka | 156/603 |
| 4,473,433 | 9/1984 | Bosch et al. | 148/1.5 |
| 4,479,847 | 10/1984 | Mc Caldin et al. | 156/624 |

FOREIGN PATENT DOCUMENTS 55-30623 10/1981 Japan .
0007926 1/1982 Japan .................. 29/576 T

*Primary Examiner*—Upendra Roy
*Attorney, Agent, or Firm*—Staas & Halsey

[57] ABSTRACT

A method for producing a semiconductor device including the steps of forming an insulating layer on a substrate, the insulating layer having a plurality of concave portions, forming a non-single crystalline silicon layer on the surface of the insulating layer. The non-single crystalline silicon is patterned so that each concave portion is independently melted and the patterned non-single crystalline silicon layer flows into each of the concave portions to form a single crystalline region by irradiation with an energy ray; and, a semiconductor element is also formed in the single crystalline region.

8 Claims, 8 Drawing Sheets

FORMING SELECTIVE SINGLE CRYSTAL REGIONS IN INSULATED POCKETS FORMED ON SILICON BY ENERGY BEAMS AND DEVICES FORMED IN THE POCKETS

This is a continuation of copending application Ser. No. 07/342,646 filed on Apr. 24, 1989, now abandoned, which is a continuation of application Ser. No. 233,890 filed on 8/18/88, abandoned; which is a continuation of application Ser. No. 105,495, filed 10/2/87, abandoned; which is a continuation of application Ser. No. 943,843, filed 12/22/86, abandoned; which is a continuation of application Ser. No. 823,839, filed 1/31/86, abandoned; which is a continuation of application Ser. No. 706,896, filed 2/28/85, abandoned; which is a continuation of application Ser. No. 454,078, filed 12/28/82, now abandoned.

BACKGROUND OF THE INVENTION

The present invention relates to a method for producing a semiconductor device, more particularly to a method for producing a semiconductor device on a single crystallized region which is formed in a concave portion of an insulating layer by melting polycrystalline silicon or amorphous silicon therein.

In one method for forming elements in a semiconductor device, proposed by the present inventors in Japanese Unexamined Patent Publication (Kokai) No. 55-98397 and Japanese Patent Application No. 56-154012 (filed Sept. 30, 1981), concave portions are formed in an insulating layer formed on a substrate, a polycrystalline silicon layer is formed on the insulating layer, and the polycrystalline silicon is melted by irradiation with a laser, electron beam, lamp, or other energy ray over the polycrystalline silicon layer to cause the polycrystalline silicon to flow into the concave portions, thereby forming single crystallized regions therein.

The problem with this method is that while the upper surfaces of the resultant single crystallized regions in the concave portions should be level with the nonconcave portions of the insulating layer, this is difficult in practice. When the molten polycrystalline silicon flows into the concave portions, more tends to flow into some portions than others. This results in some single crystallized regions protruding above and other regions recessed below the level of the nonconcave portions of the insulating layer. Further, some of the molten polycrystalline silicon may not flow into the concave portions and will remain on nonconcave portions. These problems complicate the process of production of the semiconductor device.

SUMMARY OF THE INVENTION

It is an object of the present invention to provide a method for producing a semiconductor device wherein a plurality of single crystallized regions can be formed in concave portions of an insulating layer with the upper surfaces of the regions level with the nonconcave portions of the insulating layer.

It is another object of the present invention to provide a method for producing a semiconductor device wherein the isolation, single crystallization of silicon, and uniform distribution as well as activation of impurities implanted or doped into the polycrystalline silicon formed in the concave portions can be simultaneously carried out.

According to the present invention, there is provided a method for producing a semiconductor device comprising the steps of: forming an insulating layer on a substrate, the insulating layer having a plurality of concave portions forming a non-single crystalline silicon layer on the surface of the insulating layer; patterning the non-single crystalline silicon layer so that each concave portion independently melt and flow into the concave portion to form a single crystalline region in the concave portion by irradiation with an energy ray; and forming a semiconductor element in the single crystalline region.

The present invention will now be explained in more with reference to the accompanying drawings.

DESCRIPTION OF THE PREFERRED EMBODIMENTS

Figure 1:
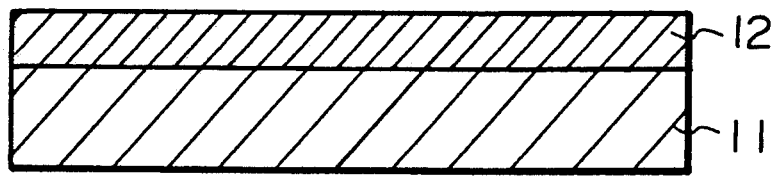
FIGS. 1A to 1U and FIG. 2 are schematic cross-sectional views of a method in accordance with an embodiment of the present invention.
Figure 1:
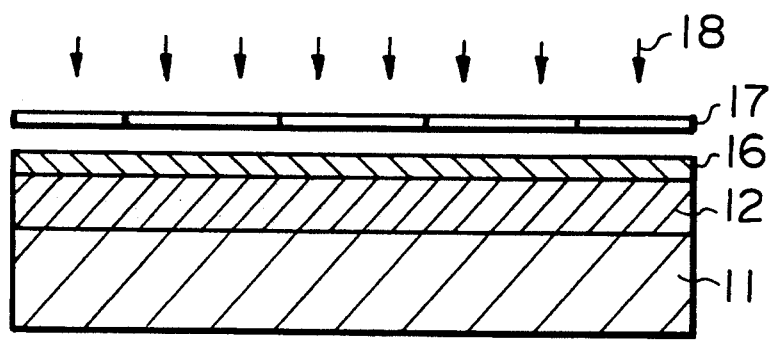
Figure 1:
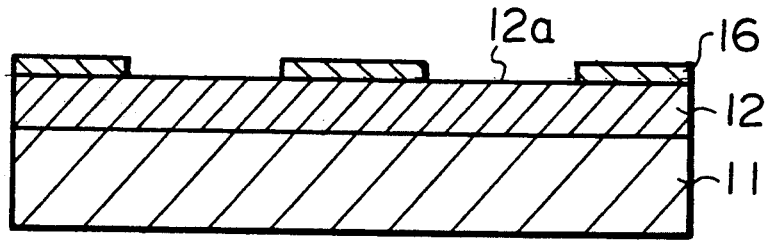
Figure 1:
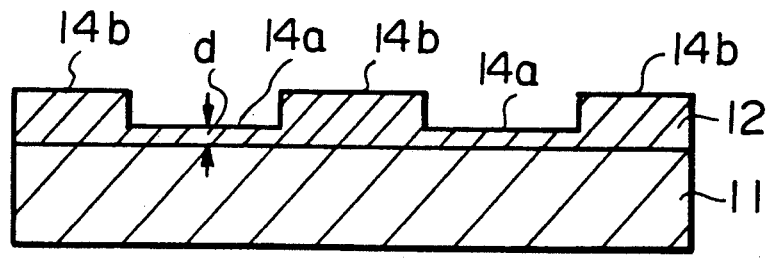
Figure 1:
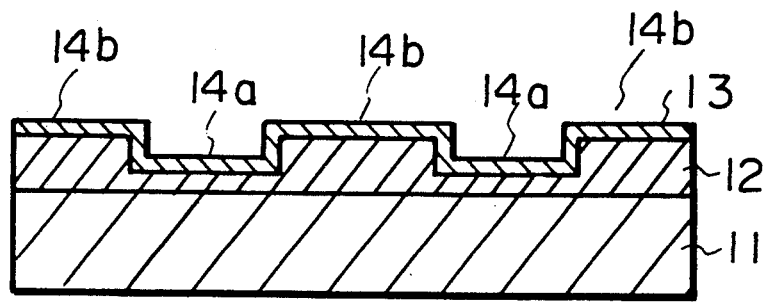
Figure 1:
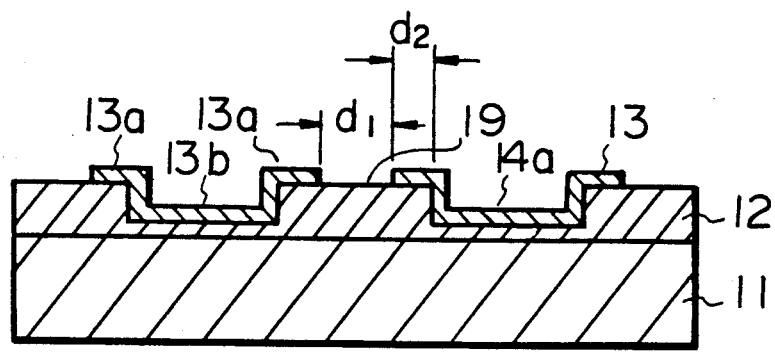
Figure 1:
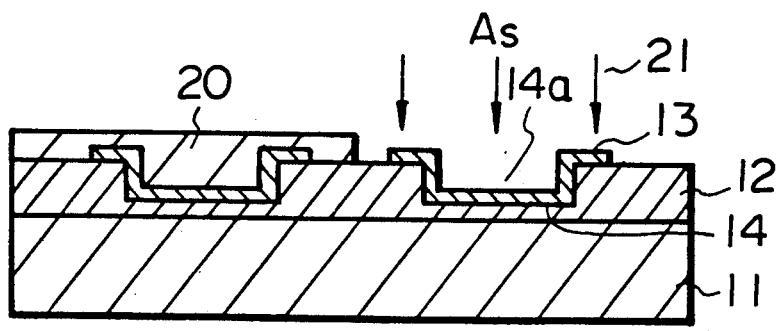
Figure 1:
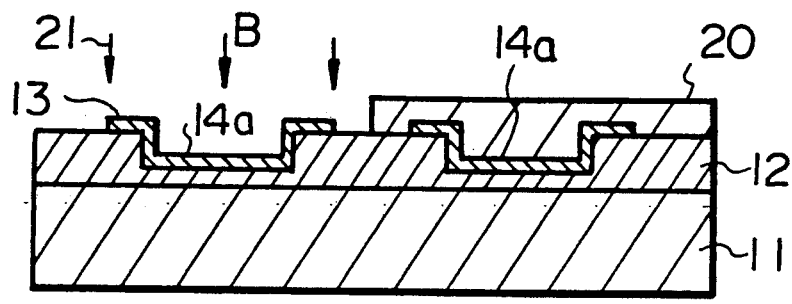
Figure 1:
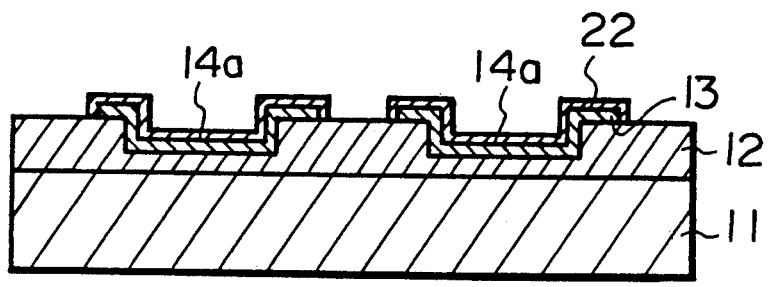
Figure 1:
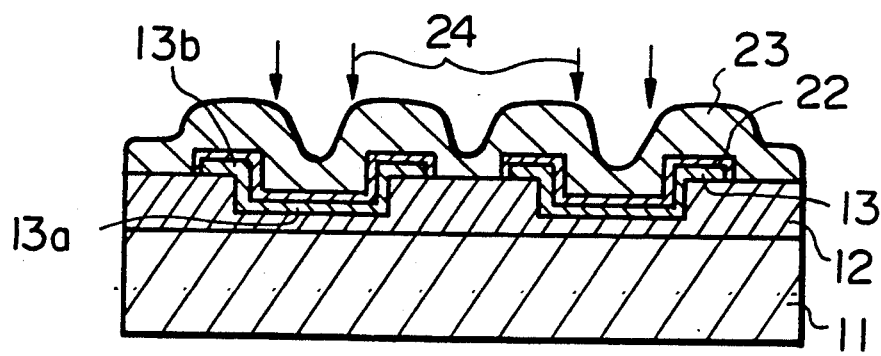
Figure 1:
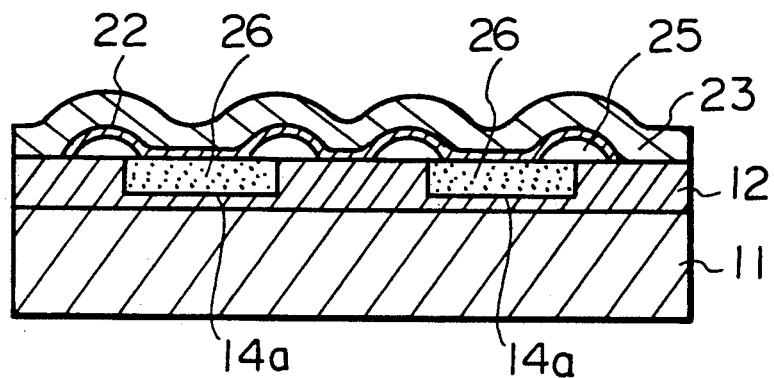
Figure 1:
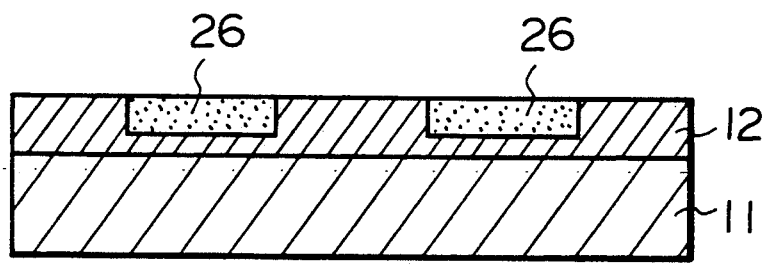
Figure 1:
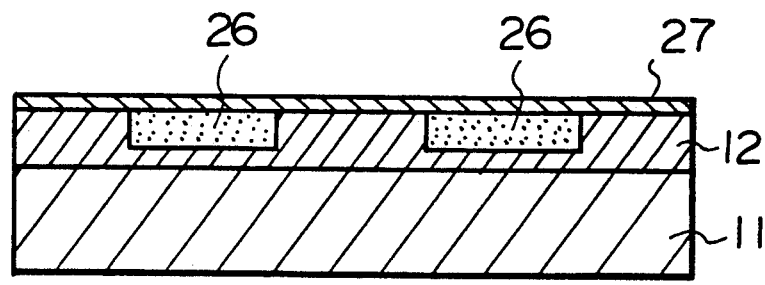
Figure 2:
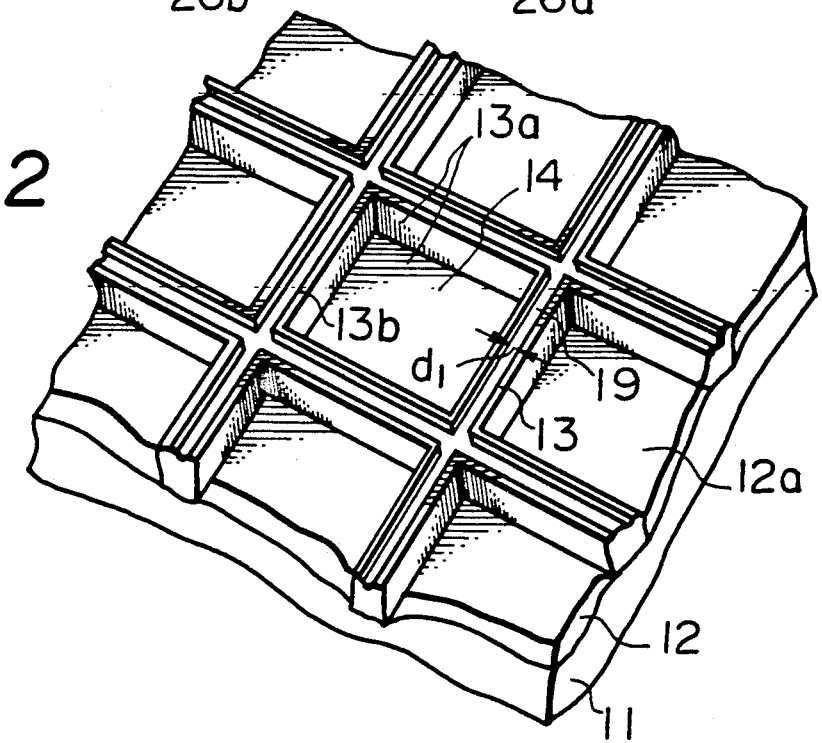

Referring to FIGS. 1A to 1U and FIG. 2, an embodiment of the method according to the present invention, first an insulating layer 12 having a thickness of approximately 1 $\mu$m (micron) is formed on a silicon substrate 11 (FIG. 1A). The insulating layer 12 is preferably selected from the group consisting of silicon dioxide, silicon nitride, oxi-nitride and alumina.

A photoresist layer 16 is formed on the insulating layer 12 and is exposed to ultraviolet rays or other energy rays 18 through a masking material 17, such as a glass mask (FIG. 1B).

The exposed region of the photoresist layer 16 is hardened by development thereof and the unexposed portion is removed, thereby forming exposed portions 12a of the insulating layer 12 (FIG. 1C).

Using the remaining photoresist layer 16 as a masking material, the exposed portions 12a of the insulating layer 12 are etched to form concave portions 14a having a depth of, for example, 0.9 $\mu$m, i.e., a thickness (d) of 0.1 $\mu$m, and nonconcave portions 14b (FIG. 1D).

A silicon layer 13 having a thickness of, for example, 0.4 $\mu$m is formed on the entire surface of the insulating layer 12, including the concave portion 14a and nonconcave portions 14b, by a chemical vapor deposition (CVD) process (FIG. 1E). The silicon layer 13 is preferably selected from the group consisting of polycrystalline silicon and amorphous silicon.

The silicon layer 13 is etched along the nonconcave portions 14b using, for example, a photoresist (not shown) as a masking material, to separate the layer 13 into different sections (FIG. 1F, FIG. 2). In the present invention, the width $d_1$ of the etched portion should be selected so that the amount of silicon in each section, i.e., the silicon remaining on the nonconcave portion 14b (regions 13a) around each concave portion 14a (regions 13b), corresponding to the amount of width $d_2$, equals the volume of the concave portion 14a. In this example, the width $d_1$ is selected to be 5 $\mu$m.

A photoresist layer 20 is formed on the silicon layer 13 of the concave portions 14a to form the P channel regions (left portion FIG. 1G) and arsenic ions are implanted in the silicon layers 13 of the concave portions 14a to form the N channel regions (right portion in FIG. 1G).

The above photoresist layer 20 is removed, another photoresist layer 20 is formed on the silicon layers 13 to form the N channel regions (right portion in FIG. 1H), and boron ions are implanted in the silicon layers 13 of the concave portions 14a to form the P channel regions (left portion in FIG. 1H).

The above photoresist layer 20 is removed and the surfaces of the silicon layers 13 are oxidized to form polyoxide layers 22 (FIG. 1I). The polyoxide layers 22 prevent the doped ions from diffusing to portions other than the silicon layers 13.

CVD or other processes are then used to form a capping insulating layer 23 of phosphosilicate glass or other materials of a thickness of approximately 1 $\mu$m over the entire surface of the insulating layer 12 and polyoxide layer 22. An energy ray 24, selected from the group consisting of laser beams, electron beam, lamps, carbon heaters, etc., is then irradiated over the insulating layer 23 to the silicon layers 13. The regions 13a of the silicon layers 13 in the concave portions 14a of the insulating layers 12 melt earlier than the regions 13b on the nonconcave portions 14b because the former is closer to the silicon substrate 11, which acts as a heat sink (FIG. 1J).

The silicon in the regions 13b melts and flows into the concave portions 14a, leaving the cavities 25. It mixes with the silicon of regions 13a and is single crystallized as regions 26. Simultaneously, the previously implanted impurities for forming the N and P channel regions are uniformly distributed and activated (FIG. 1K).

The insulating layer 23 and polyoxide layer 22 are removed. The upper surfaces of the regions 26 are substantially level with, for example only about 0.12 $\mu$m higher than, the nonconcave portions 14b of the insulating layer 12 (FIG. 1L).

After this, semiconductor elements, advantageously complementary metal oxide semiconductors (C-MOS), bipolar integrated circuits (IC), metal semiconductor, or junction and field effect transistor semiconductor display devices can be formed on the regions 26. Taking a C-MOS for example an insulating layer 27 of, for example, silicon dioxide having a thickness of 0.05 $\mu$m, is formed on the insulating layer 12 and the regions 26 (FIG. 1M).

Figure 1N:
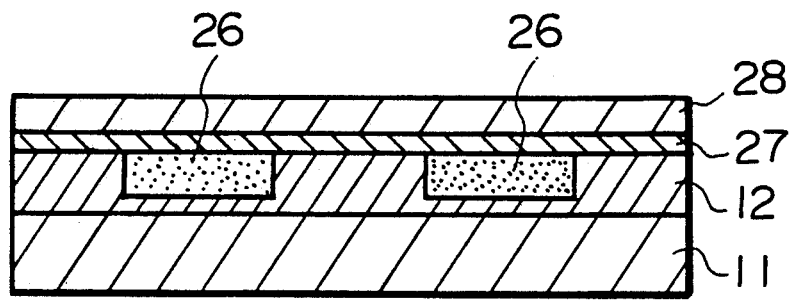

Next, a silicon layer 28 of a thickness of, for example, about 0.3 $\mu$m is formed on the insulating layer 27 by a CVD or other process (FIG. 1N).

Figure 1O:
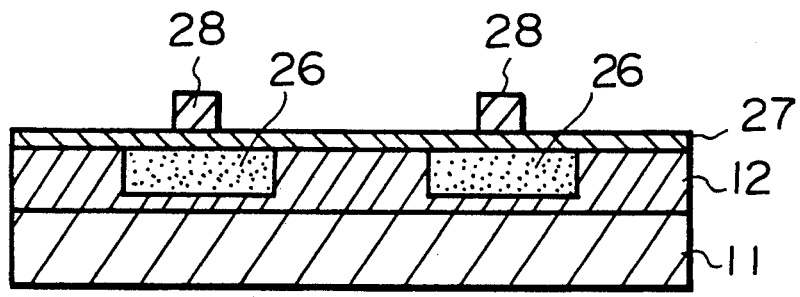

The silicon layer 28 is etched using a masking material (not shown) to form gate electrodes 28 on the insulating layer 27 (FIG. 1O).

Figure 1P:
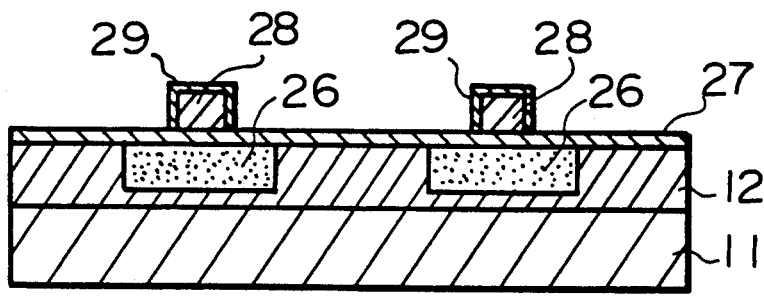
Figure 1:
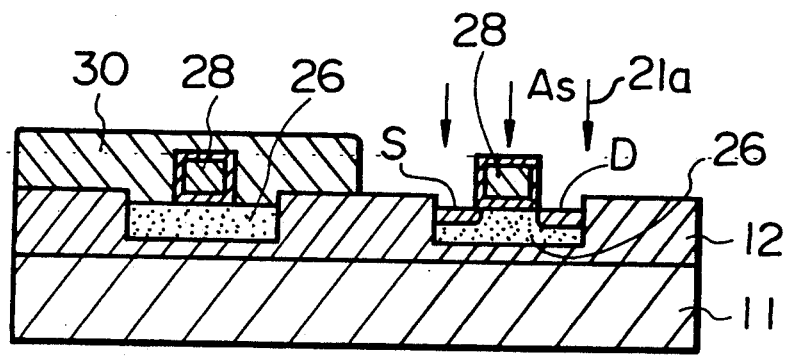
Figure 1:
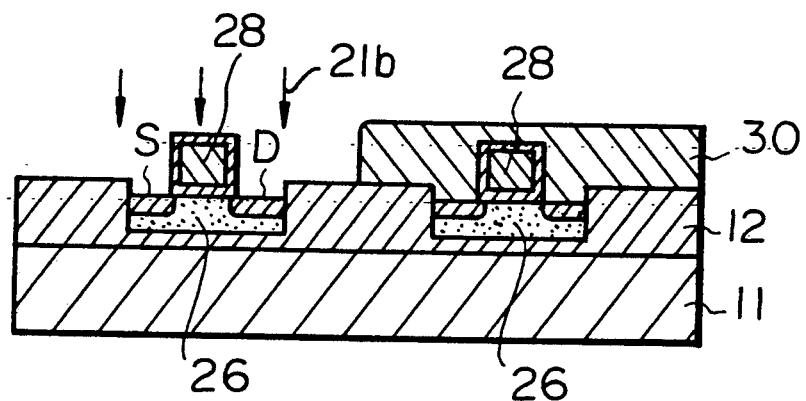
Figure 1:
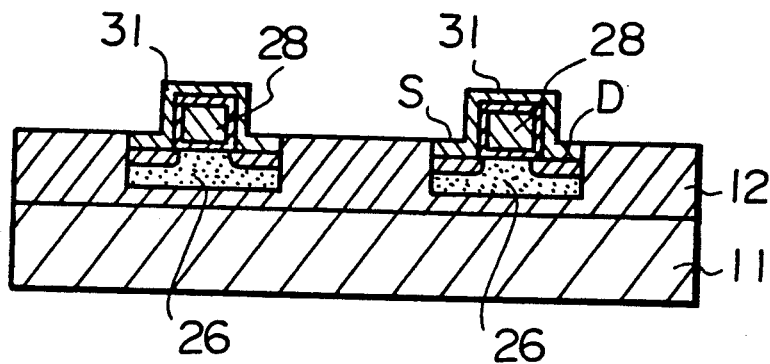
Figure 1:
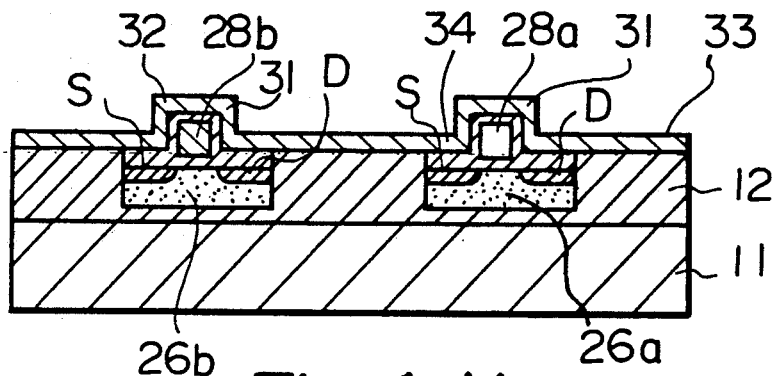
Figure 1:
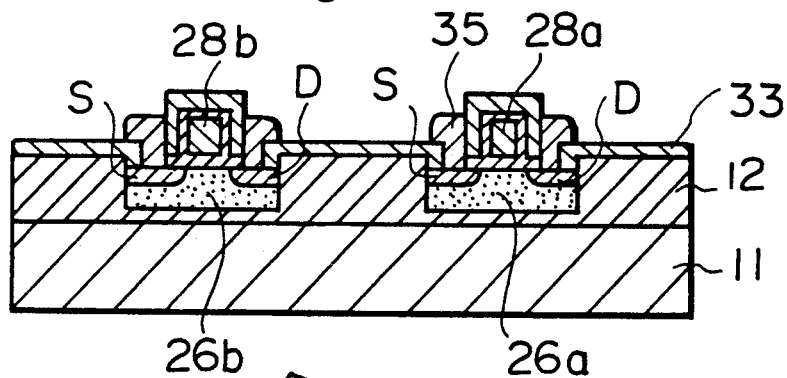

The surfaces of the gate electrodes 28 are oxidized to form thereon silicon dioxide layers 29 having a thickness of approximately 0.1 $\mu$m (FIG. 1P).

A photo mask 30 is formed on the P channel region, (left side in FIG. 1Q), and a $5 \times 10^{15}$ ions/cm$^2$ dose of arsenic ions 21a are implanted in the N channel regions (right side in FIG. 1Q) with 150 KeV to form source region S and drain region D of MOS therein (FIG. 1Q).

The above photo mask 30 is removed, after another photo mask 30 is similarly formed on the N channel region, and a $5 \times 10^{15}$ ions/cm$^2$ dose of boron ions 21b with 70 KeV are implanted in the P channel region to form source region S and drain region D therein (FIG. 1R).

The above photo mask 30 is removed, and insulating layers 31 are formed on the source regions S, drain regions D and insulating layers 29 by annealing (FIG. 1S).

A polycrystalline silicon layer 33 having a thickness of approximately 1 $\mu$m is formed on the insulating layers 12 and 31 (FIG. 1T).

Finally, the polycrystalline silicon layer 33 is etched at portions 34 to make contact holes on the source regions S and drain regions D. Aluminum wirings 35 are formed on the source regions S and drain regions D through the contact holes 34.

This completes the C-MOS.

Figure 3:
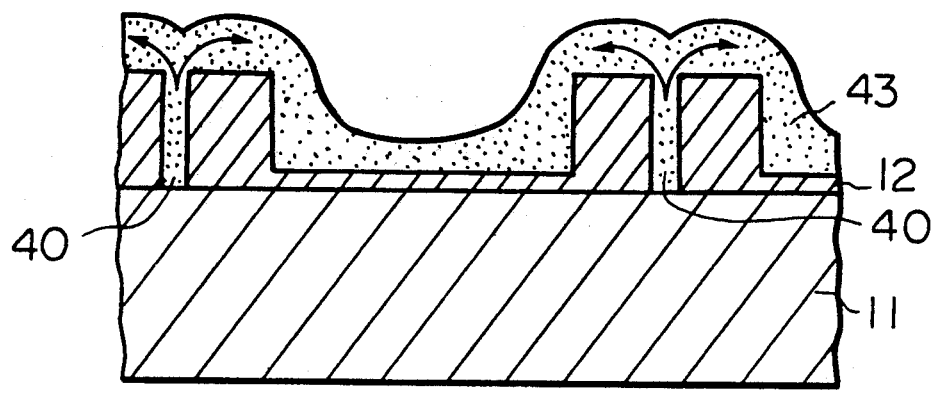
FIGS. 3 to 5 are schematic cross-sectional views of other embodiments of the present invention.

In another embodiment of the present invention, a hole 40 penetrating to the silicon substrate 11 may be formed in the non-concave portion 14b of insulating layer 12, as shown in FIG. 3, so that the silicon of layer 43 is single crystallized with the same crystal orientation as that of the silicon substrate 11.

Figure 4:
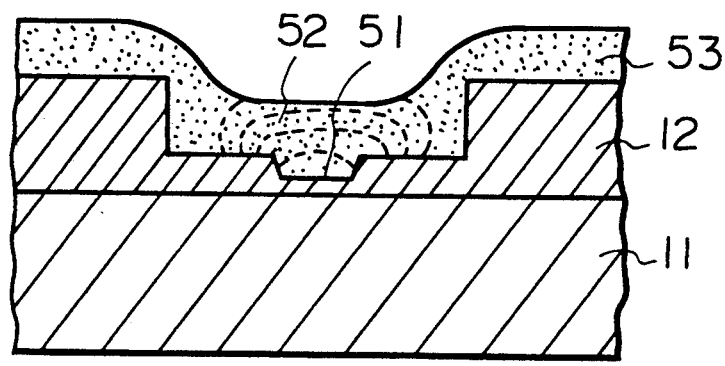

Further, another concave portion 51 may be formed at the bottom of the concave portion 14a, as shown in FIG. 4, so that the silicon positioned in the concave portion 51 melts and cools earlier than that in other portions and forms the nucleus for larger single crystalline silicon.

Figure 5:
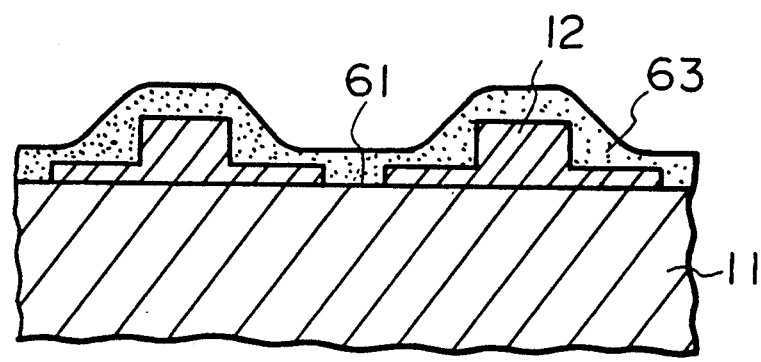

Still further, a hole 61 penetrating to the silicon substrate 11 may be formed in the bottom of the concave portion 14a, as shown in FIG. 5, so that the area of the silicon substrate 11 positioned near the hole 61 forms the nucleus for single crystallization of the molten silicon.

As is clear from the above explanation, according to the present invention, the process for producing a semiconductor device can be remarkably shortened.

We claim:

1. A method for producing a semiconductor device having a substrate, comprising the steps of:
   (a) forming a first insulating layer on the substrate, the insulating layer having a plurality of concave portions;
   (b) forming a non-single crystalline silicon layer on the surface of the first insulating layer, the non-single crystalline silicon layer having a first portion and second portion, the first portion extending from the bottom and along the sides of the concave portions and terminating at the second portion located at the surface of the first insulating layer and located between the concave portions, the thickness of the first portion being greater than the thickness of the second portion;
   (c) patterning the non-single crystalline silicon layer at the surface of the first insulating layer;
   (d) covering the patterned non-single crystalline silicon layer with a second insulating layer;
   (e) irradiating the patterned non-single crystalline silicon layer and the second insulating layer with an energy ray in a substantially vertical direction to melt the patterned non-single crystalline silicon layer such that the first portion of the non-single crystalline silicon layer having higher energy abosorptivity than that of the second portion and flows into the concave portions and then the second portion of the non-crystalline silicon layer melts and flows, and at the same time, the molten silicon layer of the first portion being solidified, thereby forming single crystalline regions in the concave portions, the volume of the patterned non-single crystalline silicon layer being substantially equal to that of the concave portions, the single crystalline regions being level with the top surface of the first insulating layer; and (f) forming semiconductor elements in the single crystalline regions.

2. A method according to claim 1, further comprising, before said step (d) of irradiation with the energy ray, the substep of introducing impurities into the non-single crystalline silicon layer and wherein said step (d) comprises simultaneously forming P type and N type regions.

3. A method according to claim 1, wherein said step (b) comprises selecting the non-single crystalline silicon from the group consisting of polycrystalline silicon and amorphous silicon.

4. A method according to claim 1, wherein said irradiation step (d) comprises selecting the energy ray from the group consisting of a photon beam, electron beam and ion beam.

5. A method according to claim 1, wherein said step (e) comprises selecting the semiconductor elements from the group consisting of metal oxide semiconductor integrated circuits (MOS ICs), bipolar ICs, MESFETs, JFETs, and semiconductor displays.

6. A method according to claim 2, further comprising, after said introducing substep, the substeps of:
   (i) forming a mask layer on the non-single crystalline silicon layer for preventing diffusion of the impurities;
   (ii) forming a cap layer on the mask layer; and
   wherein said step (d) comprises the substep of irradiating the energy ray from above the cap layer to the non-single crystalline silicon layer so as to melt and single crystallize the non-single crystalline silicon layer.

7. A method for producing a semiconductor device having a semiconductor substrate, comprising the steps of:
   (a) forming an insulating layer on the semiconductor substrate, the insulating layer having concave portions and non-concave portions;
   (b) forming a polycrystalline silicon layer on the concave portions and non-concave portions of the insulating layer, the polycrystalline silicon layer forming a side wall of the concave portions being thicker than that on the non-concave portions;
   (c) etching the polycrystalline silicon layer into sections at the non-concave portions of the insulating layer;
   (d) forming a polyoxide layer on the polycrystalline silicon layer;
   (e) irradiating the semiconductor device with an energy beam in a substantially vertical direction such that the polycrystalline silicon layer on the side wall of the concave portion having higher energy absorptivity compared to the non-concave portions and the polycrystalline silicon layer in the concave portions melts and then the non-concave portions melt and flow into the concave portions and at the same time the melted polycrystalline silicon in the concave portions becomes solidified, forming single crystalline portions in the concave portions and cavities where the non-concave portions were located so that a level surface is formed with the insulating layer; and
   (f) removing the polyoxide layer, the single crystalline regions being substantially level.

8. A method according to claim 7, wherein the non-concave portions comprise silicon and wherein said step (c) comprises etching the silicon layer to a width such that the amount of silicon in the non-concave portions is equal to the volume of the concave portions.

* * * * *

UNITED STATES PATENT AND TRADEMARK OFFICE
CERTIFICATE OF CORRECTION

PATENT NO. : 5,011,783
DATED : APRIL 30, 1991
INVENTOR(S) : TSUTOMU OGAWA ET AL.

It is certified that error appears in the above-identified patent and that said Letters Patent is hereby corrected as shown below:

```
Title Page: [57] ABSTRACT,
            line  4, "portions," should be --portions, and--;
            line  6, "silicon" should be --silicon layer--;
            line 10, "ray; and, a" should be --ray.  A--.

Col. 2,     line  8, "melt and flow" should be --melts and
                     flows--;
            line  9, "portion" should be --portions--;
            line 13, "more" should be --more detail--;
            line 17, "and FIG. 2" should be deleted;
            line 19, "invention and;" should be --invention;
                     FIG. 2 is a perspective view of an
                     embodiment of the present invention;
                     and--;
            line 66, "concave:" should be --concave--.

Col. 3,     line 56, "are" should be --is--.
```

Signed and Sealed this

Twenty-seventh Day of October, 1992

*Attest:*

DOUGLAS B. COMER

*Attesting Officer*          Acting Commissioner of Patents and Trademarks